United States Patent
Maier et al.

(10) Patent No.: US 6,891,602 B2
(45) Date of Patent: May 10, 2005

(54) DEVICE FOR ALIGNING MASKS IN PHOTOLITHOGRAPHY

(75) Inventors: Nikolaus Maier, Garching (DE); Ralf Süss, München (DE); Richard Buttinger, Landshut (DE)

(73) Assignee: Süss Micro Tec Lithography GmbH (DE)

( * ) Notice: Subject to any disclaimer, the term of this patent is extended or adjusted under 35 U.S.C. 154(b) by 0 days.

(21) Appl. No.: 10/284,888

(22) Filed: Oct. 31, 2002

(65) Prior Publication Data

US 2003/0086069 A1 May 8, 2003

(30) Foreign Application Priority Data

Nov. 2, 2001 (DE) .......................................... 101 53 851

(51) Int. Cl.[7] ........................ G03B 27/62; G03B 27/58; G03B 27/42
(52) U.S. Cl. .............................. 355/75; 355/53; 355/72
(58) Field of Search .............................. 355/72–76, 53; 430/5, 20, 30

(56) References Cited

U.S. PATENT DOCUMENTS

| 4,443,098 A | * | 4/1984 | Walwyn et al. ................ 355/74 |
| 4,766,492 A | * | 8/1988 | Miyawaki .................... 355/125 |
| 5,797,317 A | | 8/1998 | Lahat et al. ............. 101/127.1 |
| 5,909,030 A | * | 6/1999 | Yoshitake et al. ........ 250/492.2 |

FOREIGN PATENT DOCUMENTS

| DE | 19810055 A1 | 9/1999 | ............. G03F/7/20 |
| JP | 106325996 A | 11/1994 | ......... H01L/21/027 |
| JP | 11097327 A | 4/1999 | ......... H01L/21/027 |
| JP | 2001-257151 A | 9/2001 | ......... H01L/21/027 |

* cited by examiner

*Primary Examiner*—Henry Hung Nguyen
(74) *Attorney, Agent, or Firm*—Ohlandt, Greeley, Ruggiero & Perle, LLP; George W. Rauchfuss, Jr.

(57) ABSTRACT

The present invention provides a device for aligning masks in photolithography, wherein in a first mask holder for a first mask at least one adapter for a second mask can be provided, so that masks being adapted to either the first mask holder or to the at least one adapter can be used in the device. The invention is advantageous in that it allows an easy, time and cost saving changeover from one mask size to at least one different mask size.

13 Claims, 3 Drawing Sheets

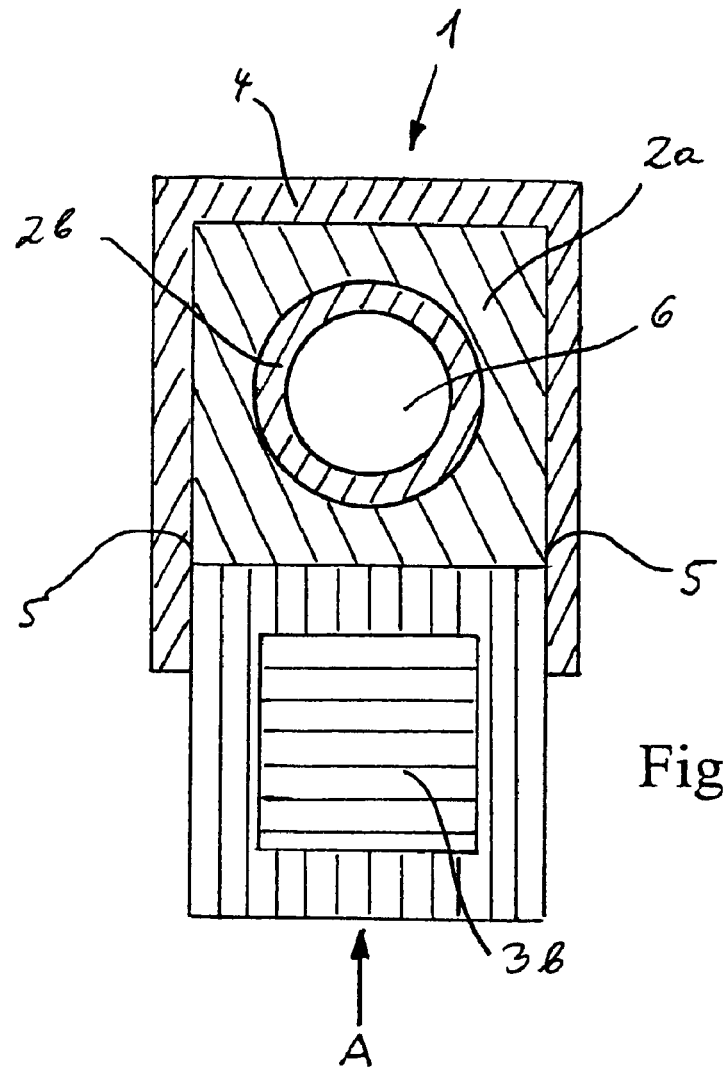
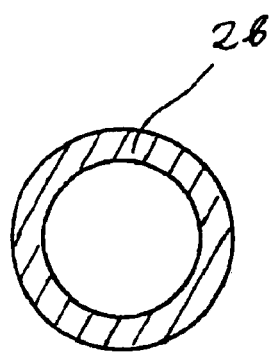
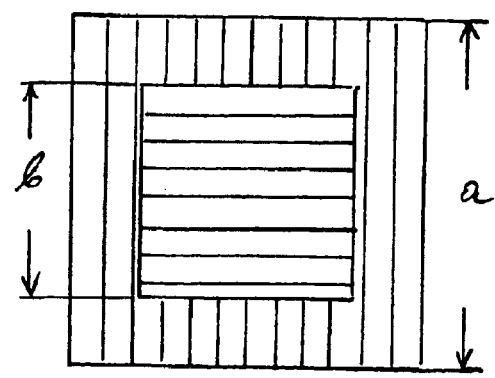
Fig. 1
Fig. 2
Fig. 3

DEVICE FOR ALIGNING MASKS IN PHOTOLITHOGRAPHY

CROSS-REFERENCE TO RELATED APPLICATION

Not applicable

STATEMENT REGARDING FEDERALLY SPONSORED RESEARCH OR DEVELOPMENT

Not applicable

INCORPORATION BTY REFERENCE OF MATERIAL SUBMITTED ON A COMPACT DISC

Not applicable

BACKGROUND OF THE INVENTION

The invention relates to a device for aligning masks in photolithography. The device according to the present invention is suitable for a quick changeover to different mask sizes during an automatic loading of masks.

In photolithography masks are used for structuring substrate (wafer) surfaces during the exposure of a photosensitive resist to light. Such a mask is disclosed, e.g., in DE-A1-198 10 055. In the industrial production of, e.g., electric components it is often necessary to use different wafer sizes. Changing the wafer size also requires a change of the mask size. Up to now it is common practice to use for a different mask size also a different mask holder and, correspondingly, to use also different mask magazines for the different masks. Replacing the mask holders and the magazines is time-consuming and leads to increased costs.

BRIEF SUMMARY OF THE INVENTION

It is the object of the present invention to provide an economical device for aligning masks in photolithography which allows a simple and quick changeover from one mask size to at least one different mask size.

This object is achieved with the features of the claims.

In achieving this object, the invention starts out from the following basic ideas.

A first mask holder, which is intended for a specific mask size, contains at least one exchangeable adapter which is preferably concentrically arranged in the first mask holder's opening or aperture through which light can pass. Without an adapter a larger mask can be held, and by inserting an adapter a smaller mask size can be used. The second mask is arranged on an area whose dimensions correspond to those of the area of the first mask. Thus, the same frame and the same guide as for the first mask can also be used for the second mask.

The invention can advantageously be used during an automatic mask loading with the same mask magazines after a simple adaptation of a present device for aligning masks. By means of the invention, the changeover of a mask size to at least one different mask size can be carried out easily in a time and cost saving manner.

BRIEF DESCRIPTION OF THE SEVERAL VIEWS OF THE DRAWINGS

In the following, the invention is explained in more detail on the basis of the drawings in which FIG. 1 shows a schematic view of an embodiment of the present invention;

FIG. 2 shows an adapter for the embodiment of the present invention according to FIG. 1;

FIG. 3 shows a mask for the embodiment of the present invention according to FIG. 1;

DETAILED DESCRIPTION OF THE INVENTION

Figure 4:
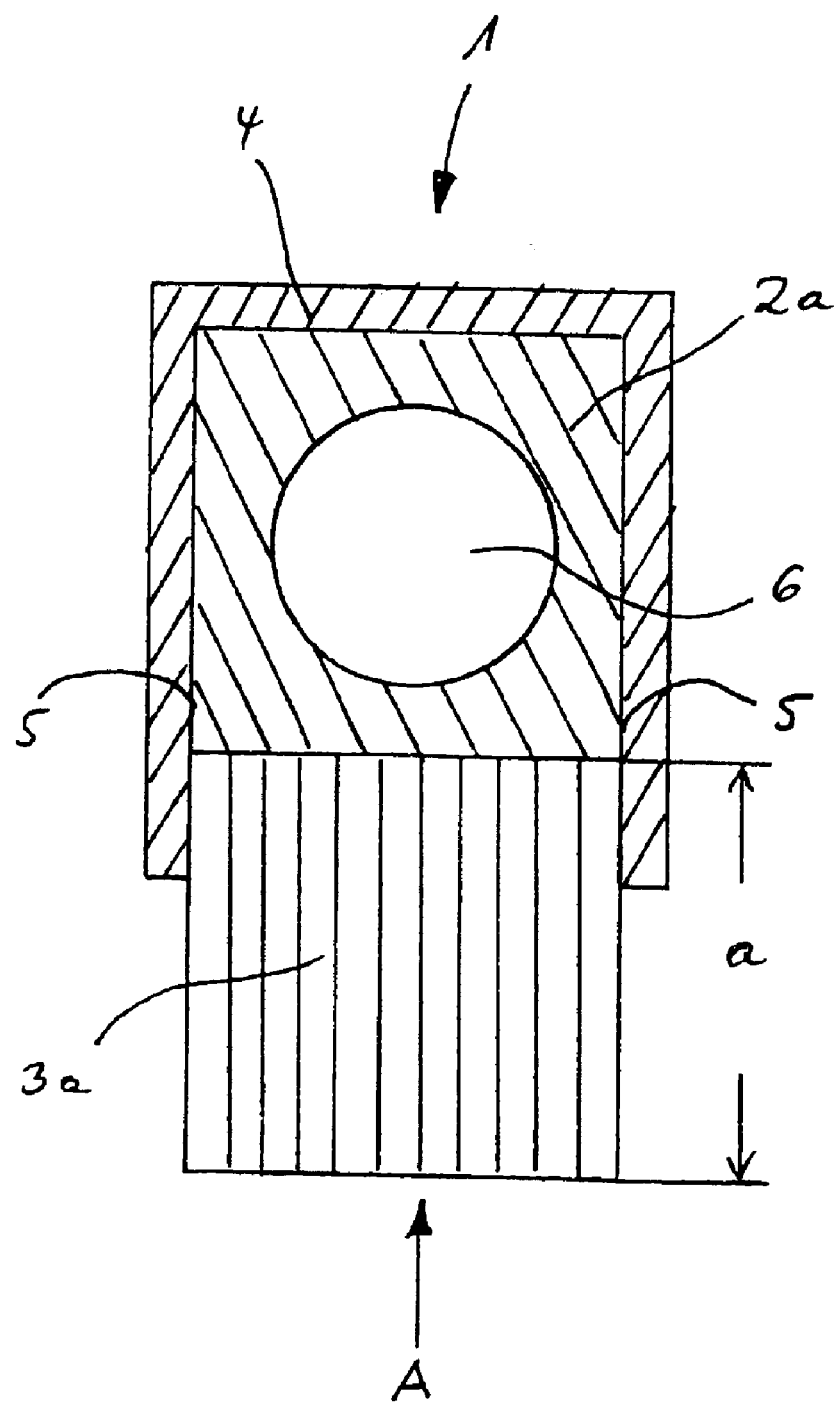
FIG. 4 shows the embodiment of the present invention according to FIG. 1 without adapter.

FIG. 1 is a schematic view of the embodiment of a device 1 according to the present invention for aligning masks in photolithography. As mask holder 2a is arranged in a frame 4. The opening 6 of the mask holder 2a comprises an exchangeable adapter 2b which also allows the use of a smaller mask than that suitable for the mask holder 2a. For a comparison, it is referred to FIG. 4 in which the mask holder 2a, which is intended for a large mask 3a, is used without an adapter. In FIG. 1 a correspondingly smaller mask 3b is provided for the adapter 2b. The mask 3b is arranged on an area having the same lateral dimensions (square with the side length a) as the mask 3a. This means that in the same device 1 with the same frame 4 and the same guide rails 5 at least one further mask 3b can be used. The device 1 can in the same manner also be adapted to two or more masks by arranging preferably concentrically further adapters in the mask holder 2a. This means that these further mask would, as the second mask 3b, be arranged on a square area having the side length a and could thus be introduced into the guide rails 5.

FIGS. 2 and 3 show isolated views of the adapter 2b and the mask 3b. The mask 3b has preferably a side length b of 229 mm (9 inch) and allows the use of a smaller wafer in the device 1 whose mask holder 2a is preferably intended for a mask having a side length a of 356 mm (14 inch).

The use of the device 1 for the 14-inch mask is shown in FIG. 4, in which the adapter 2b is removed so that the mask 3a can be used.

The device 1 is suitable for an automatic loading of masks from one and the same magazine. Since the different masks are each arranged on an area having the same side lengths, they can be stacked in the same magazine and are loaded into the device 1 in the same manner. The masks are guided in the guide rails 5 in the direction of the arrow A in FIGS. 1 and 4 over the corresponding mask holder 2a or the adapter 2b and aligned with a wafer (not shown) arranged below the device 1. After the corresponding masks have been removed in the same manner, new masks having either the same size or, after insertion of a corresponding adapter, having a smaller size can be used.

Figure 5:
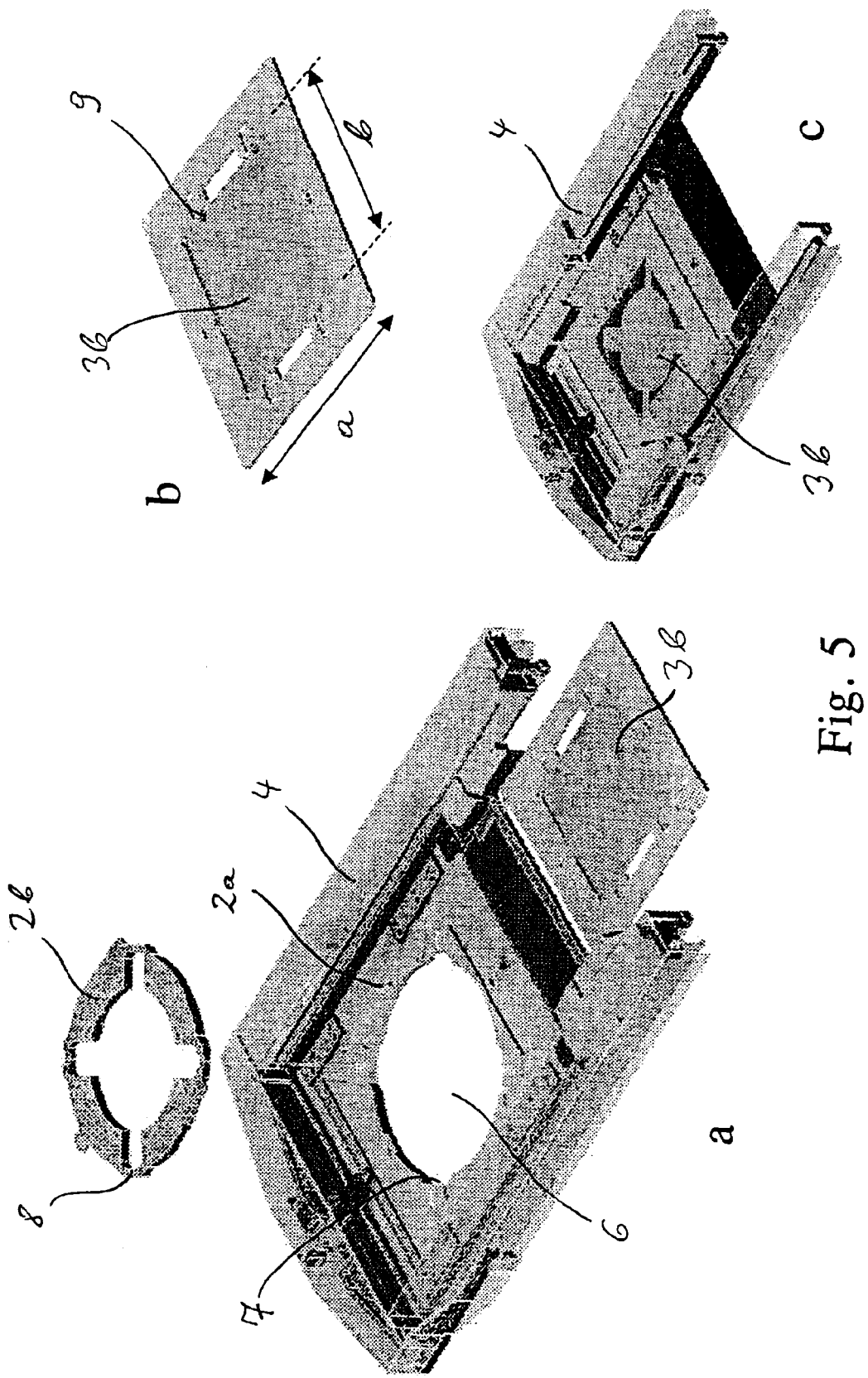
FIG. 5 is a real picture showing a perspective view of the schematic views of FIGS. 1 to 3.

FIG. 5 is a real picture showing a perspective view of the schematic view of FIGS. 1 to 3. It can be taken from FIG. 5a that the opening 6 of the mask holder 2a has recesses 7 into which corresponding projections 8 of the adapter 2b fit in order to align the adapter 2b with the mask holder 2a. FIG. 5b shows a second mask 3b having a side length b on an area having the side length a, which corresponds to the area of the 14-inch mask 3a. The mask 3b can be exchangeably held by pins at the positions 9 in the square area having the side length a. FIG. 5c shows the mask 3b on the adapter 2b, wherein the structures of the adapter show through the mask 3b.

The invention is preferably intended for quickly replacing 14-inch masks with 9-inch masks during an automated production process.

What is claimed is:

1. A device (1) for aligning masks of different sizes in photolithography, said device comprising at mask holder (2a), with an opening (6) suitable for light exposure via a mask and a frame (4) for holding and guiding a first mask (3a) having predetermined area or a second mask (3b) smaller in size than the first mask (3a) said second mask (3b) being arrangeable in a unit having an area corresponding to that of the first mask (3a) and an exchangeable adapter (2b) provided for insertion into the opening (6) in order to adapt the device for light exposure via the second mask (3b).

2. The device according to claim 1, wherein the adapter (2b) is-concentrically arranged in the opening (6).

3. The device according to claim 2, wherein the opening (6) and frame (4) is for holding the first mask (3a) having a square area having a side length of 356 mm, and the exchangeable adapter (2b) is for holding a second mask (3b) having a square area having a side length of 229 mm.

4. The device according to claim 3, wherein the first and second masks (3a and 3b) can be supplied from a same mask magazine.

5. The device according to claim 3, wherein in the first mask holder (2a) two adapters for two masks are arranged so that the device (1) can be used for three masks.

6. The device according to claim 2, wherein the first and second masks (3a and 3b) can be supplied from a same mask magazine.

7. The device according to claim 2, wherein in the first mask holder (2a) comprises a further adapter for a further mask so that the device (1) can be used for three masks.

8. The device according to claim 1, the opening (6) and frame (4) is for holding the first mask (3a) having a square area having a side length of 356 mm, and the exchangeable adapter (2b) is for holding a second mask (3b) having a square area having a side length of 229 mm.

9. The device according to claim 8, wherein the first and second masks (3a and 3b) can be supplied from a same mask magazine.

10. The device according to claim 8, wherein in the first mask holder (2a) two adapters for two masks are arranged so that the device (1) can be used for three masks.

11. The device according to claim 1, wherein the first and second masks (3a and 3b) can be supplied from a same mask magazine.

12. The device according to claim 1, wherein in the first mask holder (2a) two adapters for two masks are arranged so that the device (1) can be used for three masks.

13. A device for aligning masks for use in photolithography and permitting easy changeover from one sized mask to a different sized mask, said device comprising:
   a frame,
   a first mask holder adapted for holding a first mask, said first mask holder provided with an opening through which light can pass and said first mask holder being arranged in the frame,
   at least one exchangeable adapter for a second or further mask arranged in the opening of the first mask holder thereby forming with the first mask holder at least one second or further mask holder whereby either a first or a second or further mask can be employed in the device.

* * * * *